(12) United States Patent
Warneck

(10) Patent No.: US 9,921,288 B2
(45) Date of Patent: *Mar. 20, 2018

(54) ELECTRONIC DEVICE WITH FLEXIBLE DATA AND POWER INTERFACE

(71) Applicant: Semiconductor Components Industries, LLC, Phoenix, AZ (US)

(72) Inventor: Timothy J. Warneck, Hatfield, PA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 128 days.

This patent is subject to a terminal disclaimer.

(21) Appl. No.: 15/141,255

(22) Filed: Apr. 28, 2016

(65) Prior Publication Data

US 2016/0238687 A1    Aug. 18, 2016

Related U.S. Application Data

(62) Division of application No. 13/114,935, filed on May 24, 2011, now Pat. No. 9,329,063.

(60) Provisional application No. 61/439,704, filed on Feb. 4, 2011.

(51) Int. Cl.
*G01R 35/00* (2006.01)
*G01D 18/00* (2006.01)
*G01R 15/04* (2006.01)

(52) U.S. Cl.
CPC ......... *G01R 35/005* (2013.01); *G01D 18/008* (2013.01); *G01R 15/04* (2013.01)

(58) Field of Classification Search
CPC ..... G01D 18/008; G01R 15/04; G01R 35/005

USPC .......................................................... 307/1
See application file for complete search history.

(56) References Cited

U.S. PATENT DOCUMENTS

| 4,224,539 | A | * | 9/1980 | Musa | G01R 19/16519 323/311 |
| 4,520,488 | A | * | 5/1985 | Houvig | G08C 19/02 178/63 R |
| 5,805,466 | A | | 9/1998 | Roeckner et al. | |
| 6,324,482 | B1 | * | 11/2001 | Nakagaki | G01D 3/022 702/104 |
| 6,497,146 | B1 | | 12/2002 | Hobbs et al. | |
| 7,180,798 | B2 | | 2/2007 | Nishikawa et al. | |
| 7,526,693 | B1 | | 4/2009 | Willis et al. | |
| 8,421,588 | B1 | * | 4/2013 | Ross | G08C 17/02 340/5.1 |
| 2006/0044048 | A1 | * | 3/2006 | Nagase | G01D 3/022 327/513 |
| 2008/0239811 | A1 | * | 10/2008 | Tanaka | G11C 11/5621 365/185.11 |

FOREIGN PATENT DOCUMENTS

JP    2002111553 A    4/2002

* cited by examiner

*Primary Examiner* — Daniel Kessie
(74) *Attorney, Agent, or Firm* — Rennie William Dover

(57) ABSTRACT

Electronic modules with small and flexible interfaces are disclosed. One example electronic module includes a power supply terminal configured to receive power for the electronic module and circuitry configured to carry out various functions. The functions carried out by the electronic module circuitry include simultaneously receiving both of the following via the power supply terminal: a power signal for carrying out a mission mode operation of the electronic module, and a data signal.

5 Claims, 10 Drawing Sheets

ELECTRONIC DEVICE WITH FLEXIBLE DATA AND POWER INTERFACE

The present patent application is a divisional application of prior U.S. patent application Ser. No. 13/114,935, filed on May 24, 2011, by Timothy J. Warneck, titled "Electronic Device with Flexible Data and Power Interface," which is a nonprovisional application of U.S. patent application Ser. No. 61/439,704, filed on Feb. 4, 2011, by Timothy J. Warneck, titled "Electronic Device with Flexible Data and Power Interface," which applications are hereby incorporated by reference in their entirety, and priority thereto for common subject matter is hereby claimed.

BACKGROUND

The present invention relates, in general, to measurement systems and, more particularly, to the measurement systems for electrical signals.

Electronic devices (also referred to herein as modules) typically include a relatively small number of terminals and each terminal is typically dedicated to a specific purpose. For example, certain electronic modules have only a terminal dedicated for providing power to the module, a terminal dedicated for providing ground, and a terminal dedicated for providing output data. No terminal is provided for inputting data to such modules. A small number of dedicated terminals minimizes overall module size and simplifies the interface. Therefore, adding a new terminal for an additional purpose is undesirable, particularly if the additional purpose is not needed during mission mode operations. Including a terminal that is useful only during a configuration mode operation is undesirable for a variety of reasons. For example, an additional terminal consumes valuable space and materials and increases interface complexity, which in turn increases the risk of confusion as to which terminal is which.

Programming an electronic sensor module with sensor calibration data is one example of a function for which an additional terminal might be needed during only a limited portion of a module's lifetime. Electronic sensor modules and other similar electronic devices typically require some form of calibration of their output to compensate for incidental design variations that occur during manufacturing or other changes that occur during operational use. Electrical calibration is performed, for example, by first manufacturing the sensor module, stimulating the completed sensor module with a known stimulus, comparing the module's output with an expected output corresponding to the known stimulus, and recording in a memory a table of calibration data that is thereafter referenced by the sensor module when outputting sensor readings. Consequently, the sensor module is able to compensate for any variations detected with respect to the expected output corresponding to the known stimulus. After the electronic sensor module is calibrated and performing its sensing function, additional data input is rarely, if ever, required. Therefore, use of a dedicated terminal for entering calibration data is undesirable because the dedicated terminal would have little use relative to other terminals while consuming valuable space and materials and increasing interface complexity.

A variety of techniques exist for loading calibration data into an electronic sensor module or other electronic module without using a dedicated terminal. However, certain existing techniques require integration of overdriving circuitry into the electronic module, which consumes a large area and large amounts of power. Moreover, many existing techniques preclude or prevent any data from being output by the electronic module while calibration data is loaded.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
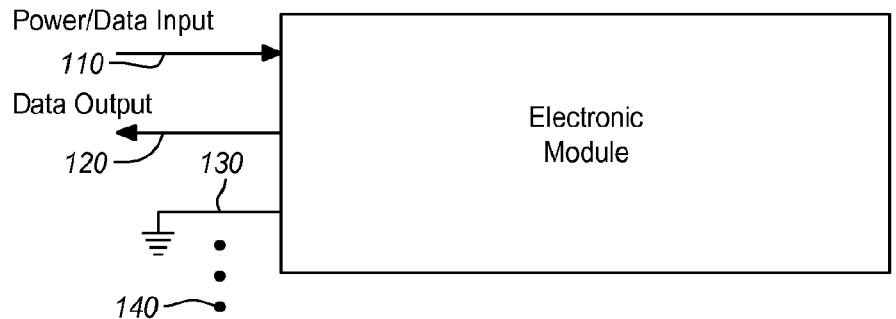
FIG. 1 depicts a general embodiment of an electronic module with a small and flexible interface.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

Reference will now be made to the figures wherein like structures will be provided with like reference designations. It is understood that the figures are diagrammatic and schematic representations of presently preferred embodiments of the invention, and are not limiting of the present invention, nor are they necessarily drawn to scale.

Embodiments of electronic modules and methods of using such modules described herein provide, among other things, efficient use of input and output terminals, thereby decreasing interface complexity and circuit footprint size. Moreover, certain embodiments provide full duplex bidirectional data communications with the module during a configuration or programming mode.

In an example embodiment, a sensor module includes a power supply terminal configured to receive power for the sensor module and circuitry configured to carry out various functions. The functions carried out by the sensor module circuitry include receiving an uncalibrated sensor signal from a sensor and, via the power supply terminal, receiving both power and calibration data from a source external to the sensor module. The sensor module circuitry functions also include calibrating the uncalibrated sensor signal based on the received calibration data.

In another example embodiment, a method of configuring and operating a sensor module includes, via a multi-use terminal on the sensor module, receiving both power and calibration data from a source external to the sensor module. The method further includes receiving an uncalibrated sensor signal from a sensor, calibrating the uncalibrated sensor signal based on the received calibration data, and outputting the calibrated sensor signal via a data output terminal on the sensor module.

Although the description provided herein is primarily directed to embodiments of electronic sensor modules that output calibrated sensor readings, application of the invention is not limited to use with or in electronic sensor modules only. The sensor module embodiments of the invention described herein are merely illustrative of certain benefits of the invention. Those skilled in the art will appreciate that other types of electronic modules, including controllers, data loggers, or any other device for which a remote control interface is desired can also benefit from the principles of the invention.

FIG. 1 is a schematic block diagram of an electronic module 100 in accordance with a general embodiment of the present invention. The module 100, which may be a single integrated circuit, a circuit board assembly with discrete components, or a combination thereof, has an interface to external circuitry comprising three terminals: a power supply and data input (i.e., multi-use) terminal 110, an output terminal 120, and a ground or reference voltage terminal 130. Although the module 100 is illustrated as having only terminals 110, 120, and 130, the vertical ellipses 140 represent that the module may include any positive integer (one or more) of terminals which may be configured as digital only, analog only, or switchable between digital and analog, depending on the module's design and/or operation mode. In certain embodiments, however, the terminals do not include a dedicated data input terminal and/or the number of terminals is limited to three to simplify the interface and make a highly self-contained module. In this description and in the claims, a terminal means any input terminal, output terminal, or input/output terminal of the module, regardless of the physical form of that terminal. Thus, a terminal can be a conductive pin that protrudes, a contact pad, an inductive terminal, a radio frequency terminal, or a terminal of any other type that is capable of receiving and/or transmitting control, data, or power as a digital or analog signal. The principles of the present invention are not limited in any way to the form of the terminals, and thus the term "terminal" should be broadly construed. Moreover, where reference is made herein to voltage signals, equivalent signals, such as current signals, inductive signals, radio frequency signals, etc., can be used instead.

As with the other circuit drawings provided herein, FIG. 1 is only a circuit block diagram that is used to introduce some basic components that may be used to practice embodiments of the present invention. Accordingly, the figure is not drawn to scale, nor does the placing of the various components imply any sort of actual physical position or connectivity on a circuit.

In one embodiment of the present invention, the power supply and data input terminal 110 is a multi-use terminal that can be used differently in different modes of the module 100. In a normal mode, the multi-use terminal is used for a single purpose—receiving power, such as a constant voltage level to power components within the module 100. In contrast, in a configuration mode, the multi-use terminal 110 is used for two purposes—receiving power, as in the normal mode, and receiving data. The data input over the multi-use terminal 110 may be executable instructions and/or reference data intended for use during the configuration mode and/or the normal mode. For example, the data received over the multi-use terminal 110 may be calibration data used to calibrate raw sensor data output from a sensor integrated with or communicatively coupled to the electronic module 100. An electronic sensor module may be configured to reference the calibration data when processing the raw sensor data and output appropriately calibrated sensor data via the output terminal 120 in both the normal mode and the configuration mode.

Figure 2:
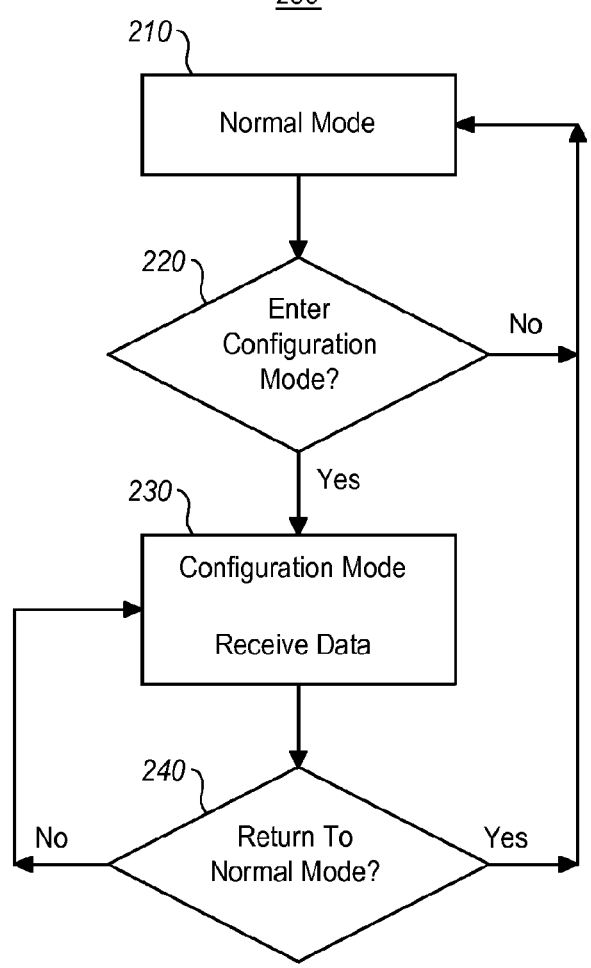
FIG. 2 depicts a method of using the small and flexible interface of the electronic module in FIG. 1 to configure the electronic module.

Control circuitry (not shown) in the module 100 controls the operation mode of the module 100. FIG. 2 illustrates a flowchart of a method 200 that may be implemented by control circuitry in the module 100 to thereby control the operation modes of the module 100 in accordance with one embodiment of the present invention. The method 200 may be implemented when the control circuitry is first placed in a known state. For instance, the control circuitry may be configured to automatically enter a known reset state in response to receiving a reset signal from a power-on-reset component within the module 100 or a reset pin external to the module 100. Once the module is placed in the known state, an initialization routine may be carried out and the module 100 may then enter a normal mode (stage 210).

While operating in the normal mode, the sensor module 100 carries out its normal or mission mode function(s), e.g., reading, processing, and outputting sensor data. If, during normal mode operations, a first predetermined criterion or set of criteria is satisfied (decision stage 220), the module 100 enters a configuration mode (stage 230). Otherwise, the module 100 remains operating in the normal mode (stage 210).

While operating in the configuration mode, the multi-use terminal 110 continues to supply a power signal and the module 100 listens for data to be received over the power signal on the multi-use terminal 110. The received data may be, for example, calibration data used to calibrate raw sensor data output from a sensor. In certain embodiments, the module 100 may also continue to carry out its normal function(s), e.g., reading, processing, and outputting sensor data, when operating in the configuration mode. If, during configuration mode operations, a second predetermined criterion or set of criteria is satisfied (decision stage 220), the module 100 returns to the normal mode (stage 210). Otherwise, the module remains operating in the configuration mode (stage 230).

The first predetermined criteria that causes the module 100 to enter the configuration mode may be a first predetermined signal level that is applied from a source external to the module 100 for a first predetermined amount of time. Circuitry in the module 100 may be configured to recognize the first predetermined signal level applied to the multi-use terminal 110 (stage 220) to trigger entry into the configuration mode (stage 230) after the first predetermined amount of time. To avoid a false triggering of the configuration mode due to noise on the multi-use terminal 110, the first predetermined amount of time may exceed the duration of noise signals that are expected to reach or exceed the first predetermined signal level.

The second predetermined criteria that causes the module 100 to return to the normal mode (decision stage 240) may include a second predetermined signal level that is applied from the external source to the multi-use terminal 110. The second predetermined criteria may be the same as or similar to the first predetermined criteria. For example, the second predetermined criteria may include detection of the first predetermined signal level applied to the multi-use terminal 110 for the first predetermined amount of time or for a second predetermined amount of time that differs from the first predetermined amount of time. Alternatively, the second predetermined criteria may include expiration of a countdown timer onboard the module 100 that begins counting down after the configuration mode is entered. If desired, the module 100 may also be configured to enter additional modes in response to other predetermined signaling levels or bit sequences input over the multi-use terminal 110. Examples of additional modes include, but are not limited to, a testing mode, a calibration mode, a programming mode, a start up mode, a verification mode, etc.

Figure 3:
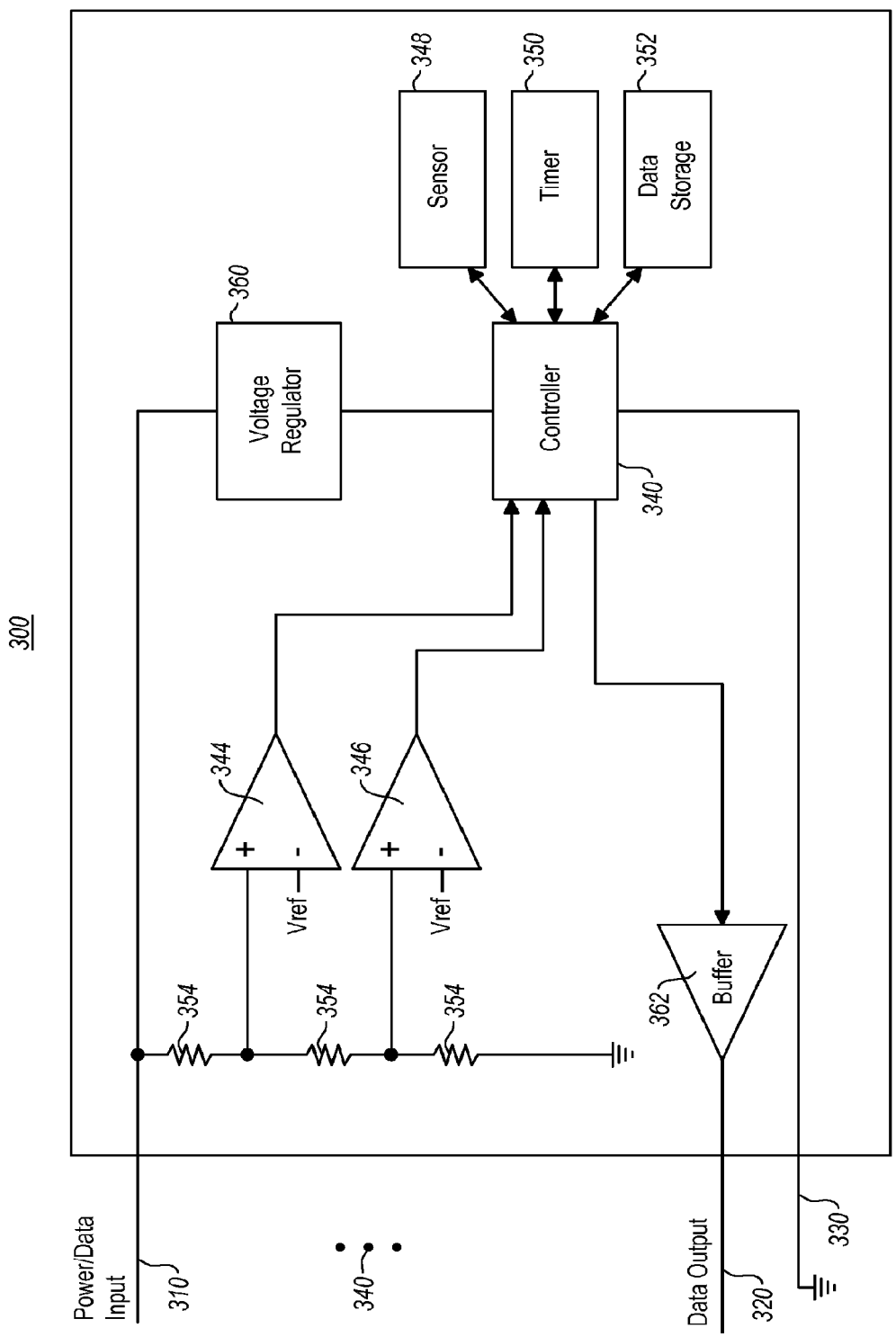
FIG. 3 depicts a second embodiment of an electronic module that is more detailed than the general embodiment of FIG. 1.
Figure 4:
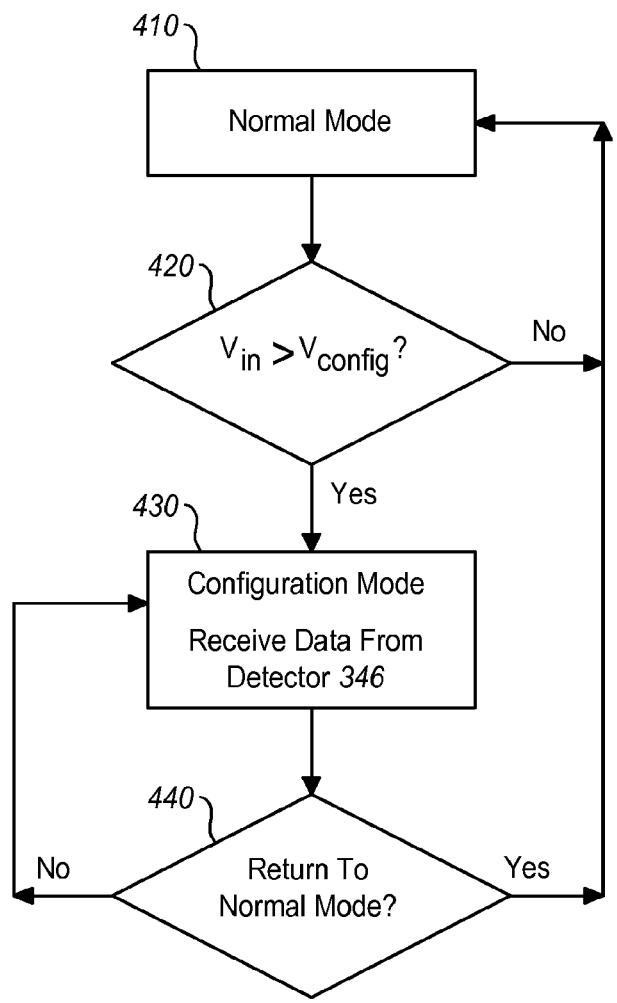
FIG. 4 depicts a method of using the small and flexible interface of the electronic module in FIG. 3 to configure the electronic module.
Figure 5A:
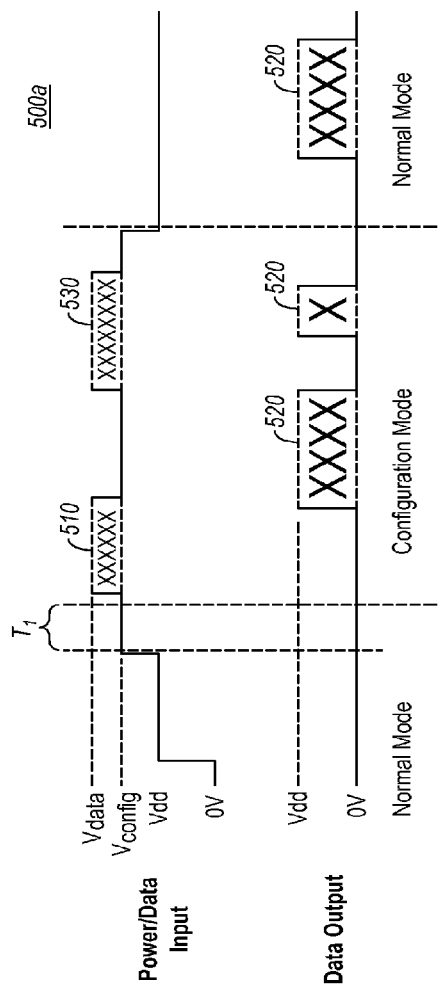
FIGS. 5A and 5B depict graphs of signaling levels at input and output terminals of the electronic module of FIG. 3 during different modes of operation.
Figure 5B:
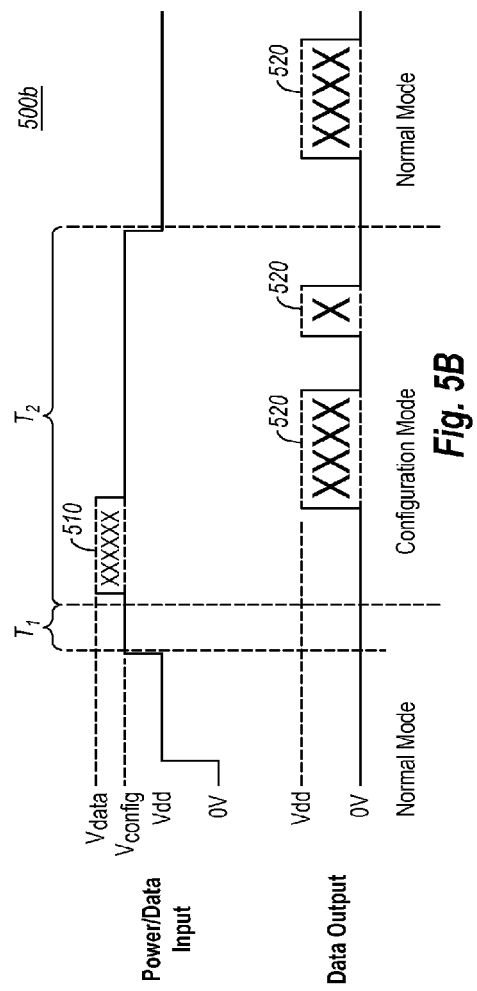

FIG. 3 illustrates an electronic sensor module 300 that represents a more specific embodiment of the electronic module 100 of FIG. 1. FIG. 4 illustrates a flowchart of a method 400 for controlling the various operation modes of the module 300 of FIG. 3 and FIGS. 5A and 5B illustrate graphs 500a and 500b, respectively, of signaling levels versus time at the input and output terminals of the module 300 during different modes of operation. Accordingly, the module 300 of FIG. 3 will now be described with frequent reference to the method 400 of FIG. 4 and the graphs 500a and 500b of FIGS. 5A and 5B.

Referring to FIG. 3, the module 300 includes terminals 310, 320, and 330 (similar to corresponding terminals 110, 120, and 130 of module 100 in FIG. 1) and vertical ellipses 340 representing additional non-data-receiving terminals that are optionally included. The module 300 also includes circuitry comprising a controller 340, detectors 344 and 346, a sensor 348, and a timer 350. The detectors 344 and 346 are configured to receive an input voltage from the multi-use terminal 310 and to output detection signals to the controller 340. As will be discussed in more detail below, the signal detected by the detector 344 is a mode selection signal and the signal detected by the detector 346 is a configuration data carrying signal, which the controller 340 receives from the detector 346 and stores in a data storage unit 352, such as a nonvolatile memory unit, that is communicatively coupled to the controller 340.

As shown in FIG. 3, the detectors 344 and 346 may include logic comparators that can compare a received input with a reference voltage $V_{ref}$. Comparators often require a level shifting of input voltage levels, which can be performed by a high impedance voltage divider network or any similar voltage level shifting circuitry. For example, a network of voltage dividing resistors 354 are optionally included in the module 300 and the values of the resistors are selected to shift the expected voltage from the multi-use terminal 310 to levels that the comparators can accurately detect. One or both of the comparators 344 and 345 and the voltage dividing resistors 354 of the voltage dividing network collectively comprise circuitry referred to herein as data detection circuitry.

Referring now to FIG. 4, after power up of the module 300 and a start-up or initialization routine, the module 300 enters a normal mode (stage 410). While operating in the normal mode, the sensor module 300 carries out its normal function(s), e.g., reading, processing, and outputting sensor data. At any time during normal operations, if the controller 340 receives an indication from the detector 344 that a voltage level $V_{in}$ detected on the multi-use terminal 310 is greater than a first predetermined level $V_{config}$ for a predetermined amount of time (decision stage 420), the controller 340 causes the module 100 to enter a configuration mode (stage 430). Otherwise, the module 300 continues to operate in the normal mode (stage 410).

Referring now to FIG. 5A, the first predetermined level of voltage $V_{config}$ and a first predetermined amount of time $T_1$ comprise a first set of predetermined criteria that governs whether the module 300 enters the configuration mode. For example, as indicated by the vertical dashed lines and the modes labeled along the horizontal time axis, the module 300 enters the configuration mode if a voltage on the multi-use terminal 310 remains at or above the first predetermined voltage level $V_{config}$ for the predetermined time period $T_1$ or longer. The first time period $T_1$ may be measured by the timer 350 and/or a time constant and/or hysteresis lag value, which may be designed into or inherent in the particular detector used. To avoid a false triggering of the configuration mode due to noise on the multi-use terminal 310, the time period $T_1$ may exceed the duration of noise signals that are expected to reach or exceed the first voltage level $V_{config}$.

With continued reference to the graph 500a of FIG. 5A, while operating in the configuration mode, the sensor module 300 listens for data 510 to be received on the multi-use terminal 110. The received data may be calibration data used to calibrate raw sensor data output from the sensor 348. The configuration data 510 is detected by the detector 346. The configuration data may be communicated by modulating the voltage level on the multi-use terminal 310 between the first voltage level $V_{config}$ and a second voltage level $V_{data}$ that is higher (as shown in the graph 500a) or lower than the first voltage level $V_{config}$.

As shown in the graph 500a, the first voltage level $V_{config}$ and the second voltage level $V_{data}$ are both higher than a power supply voltage $V_{dd}$, but they may instead be lower than the power supply voltage $V_{dd}$. One reason for setting the first voltage level $V_{config}$ and the second voltage level $V_{data}$ higher than the power supply voltage $V_{dd}$ is to enable the module 300 to remain powered while operating in the configuration mode. Alternatively, one or both of first voltage level $V_{config}$ and the second voltage level $V_{data}$ are lower than the power supply voltage $V_{dd}$ but high enough to continue to provide sufficient power to the module 300. Consequently, while in the configuration mode the module 300 may be able to not only write received data to the data storage unit 352 but also carry out normal mode operation(s), such as reading, processing, and outputting sensor data 520 via the output terminal 320. Thus, certain embodiments of the module 300 are capable of full duplex bidirectional communications in the configuration mode and the controller 340 can carry out the normal functions of the sensor module 300 to demonstrate whether the module 300 is operating in a calibrated fashion. If the module 300 is not operating properly, a new set of calibration data can be transmitted to the module 300 as many times as necessary until the data from the output terminal 320 satisfies an operator or external automatic test device that the module 300 has been properly calibrated before entering the normal mode.

Referring again to the method 400 of FIG. 4, if a second predetermined criterion or set of criteria is satisfied (decision stage 440), the module 100 returns to the normal mode (stage 410). Otherwise, the module remains operating in the configuration mode (stage 430). The second predetermined criteria may include a predetermined data sequence 530 detected by the detector 346, which the controller 340 receives and, in response thereto, causes the module 300 to return to the normal mode (stage 410). Alternatively, the second predetermined criteria may include a predetermined voltage level, such as the first voltage level $V_{config}$ or another predetermined voltage level, e.g., between the power supply level $V_{dd}$ and the first voltage level $V_{config}$. As another alternative, the second predetermined criteria may include expiration of a second predetermined time period $T_2$, as illustrated in the graph 500b of FIG. 5B. The second predetermined time period $T_2$ may be measured by the timer 350. For example, the controller 340 can cause the timer 350 to begin counting down the predetermined time period $T_2$ upon entering the configuration mode.

Referring again to FIG. 3, additional components that may be present in the sensor module 300 include a voltage regulator 360 and an output buffer 362. The voltage regulator 360 may be present if there is a risk that the overvoltage levels input over the multi-use terminal 310 will overdrive and therefore damage certain components of the module 300 that derive power from the $V_{dd}$ voltage on the multi-use terminal 310. Otherwise, the voltage regulator may be omitted to conserve space. Moreover, various components, such as the sensor 348, the timer 350, and the data storage unit 352 may be external to the sensor module 300. For example, in certain applications the sensor 348 is a relatively large unit and/or is located in a remote region with environmental conditions that are hostile to electronic circuitry and therefore cannot easily be included in an integrated circuit or circuit board assembly.

Figure 6:
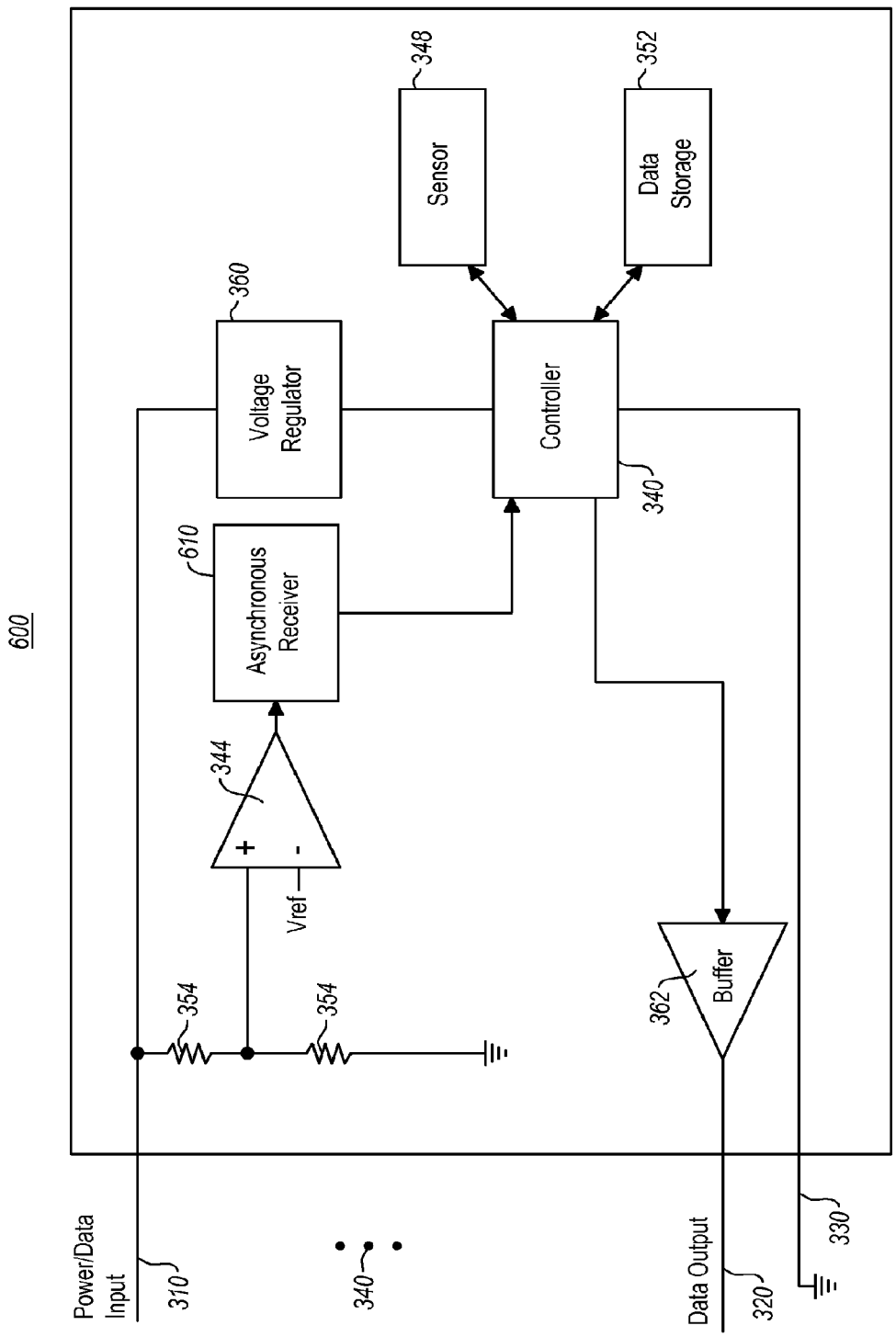
FIG. 6 depicts a third embodiment of an electronic module that is able to transition modes without use of a timer.

FIG. 6 illustrates an electronic sensor module 600 in accordance with another embodiment of the present invention. The module 600 primarily differs from the module 300 in its omission of the timer 350 and the detector 346. Thus, the module 600 is configured to enter the configuration mode without the use of a timer to measure a period of time that the multi-use terminal 310 is set at or above a predetermined voltage level, such as $V_{config}$. Instead, the module 600 is configured to enter the configuration mode when a unique configuration mode code is asynchronously detected on the multi-use terminal 310. Similarly, another unique code can be designated to signal return to the normal mode after configuration is complete.

Figure 7:
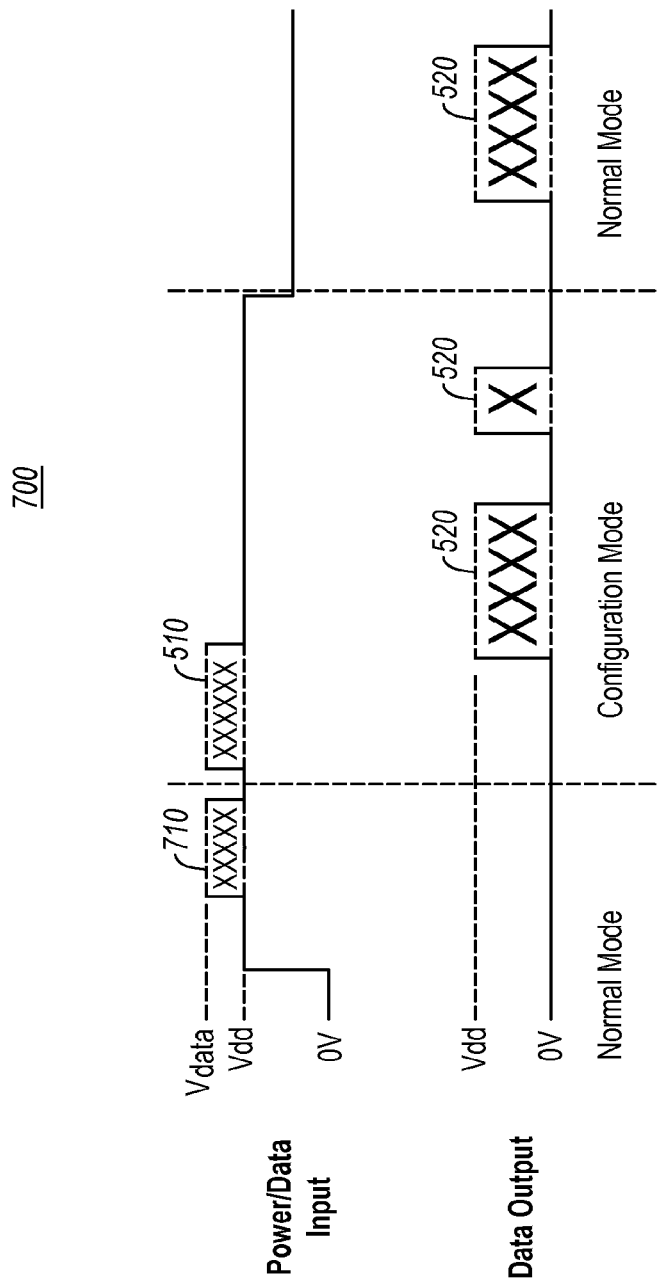
FIG. 7 depicts graphs of signaling levels at input and output terminals of the electronic module of FIG. 6 during different modes of operation.

FIG. 7 illustrates a graph 700, of signaling levels versus time at the input and output terminals of the module 600 during different modes of operation. As shown in the graph 700, a unique code 710 is transmitted by an external source (not shown), such as a programming module, on multi-use terminal 310, which the controller 340 receives and recognizes as a signal to enter the configuration mode. Because a unique code is used to trigger the configuration mode instead of a predetermined voltage level, such as the first voltage level $V_{config}$, the calibration data may be received by detecting modulation of the multi-use line between the power supply level $V_{dd}$ and the second voltage level $V_{data}$. Moreover, the second voltage level $V_{data}$ may be lower, e.g., at the level of the first voltage level $V_{config}$.

To implement asynchronous detection of a unique code, an asynchronous receiver 610, such as a universal asynchronous receiver/transmitter, is included in the module 600 to receive the output of the detector 344 and transmit a serial data stream to the controller 340. The asynchronous receiver 610 detects a serial data stream input over the multi-use terminal 310. The controller 340 later processes and decodes the serial data stream to determine if it matches a unique identification code that is designated to trigger the configuration mode in the module 600. It will be appreciated by those of skill in the art, that a protocol and/or handshaking that is established after the configuration mode is entered may be implemented in any of various ways depending on an overall system architecture or how an external data source and the module 600 are configured to handle communications.

Figure 8:
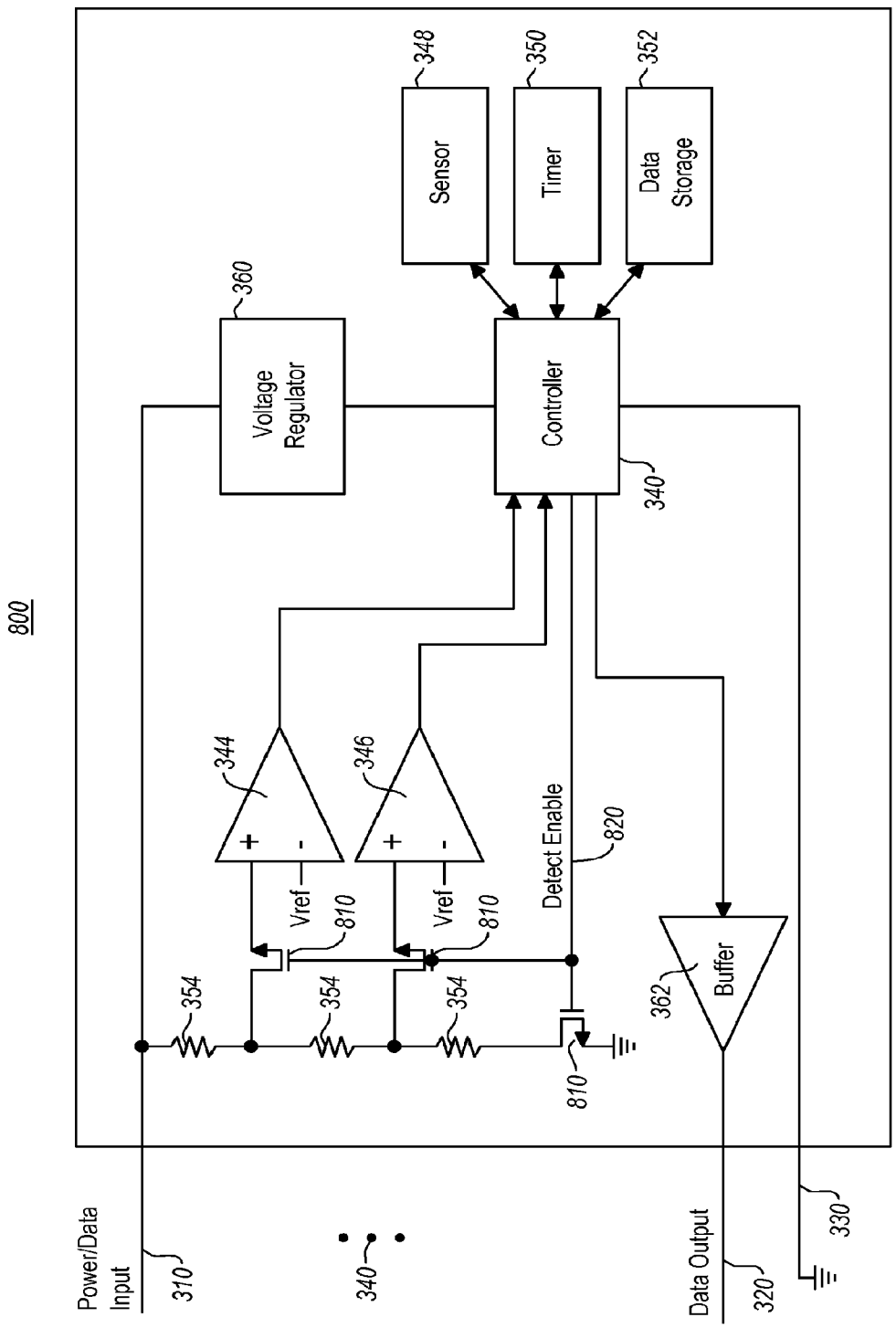
FIG. 8 depicts a fourth embodiment of an electronic module that conserves more power than the third embodiment of FIG. 6 with use of a detect enable signal.

FIG. 8 illustrates an electronic sensor module 800 in accordance with another embodiment of the present invention. The module 800 includes all of the circuitry in the module 300 and also includes a set of switches 810 that are controlled by a detect enable signal 820 from the controller 340. The voltage divider network of resistors 354 consumes power even when not being used. Therefore, in the module 800, the timer 350 controls a window of time in which the controller 340 asserts the detect enable signal 820 and listens to the multi-use terminal 310 for configuration data to be received. Assertion of the detect enable signal 820 opens the switches 810 to disable the voltage divider network when not in use. Accordingly, power that would otherwise be dissipated by the voltage divider network is conserved.

Figure 9:
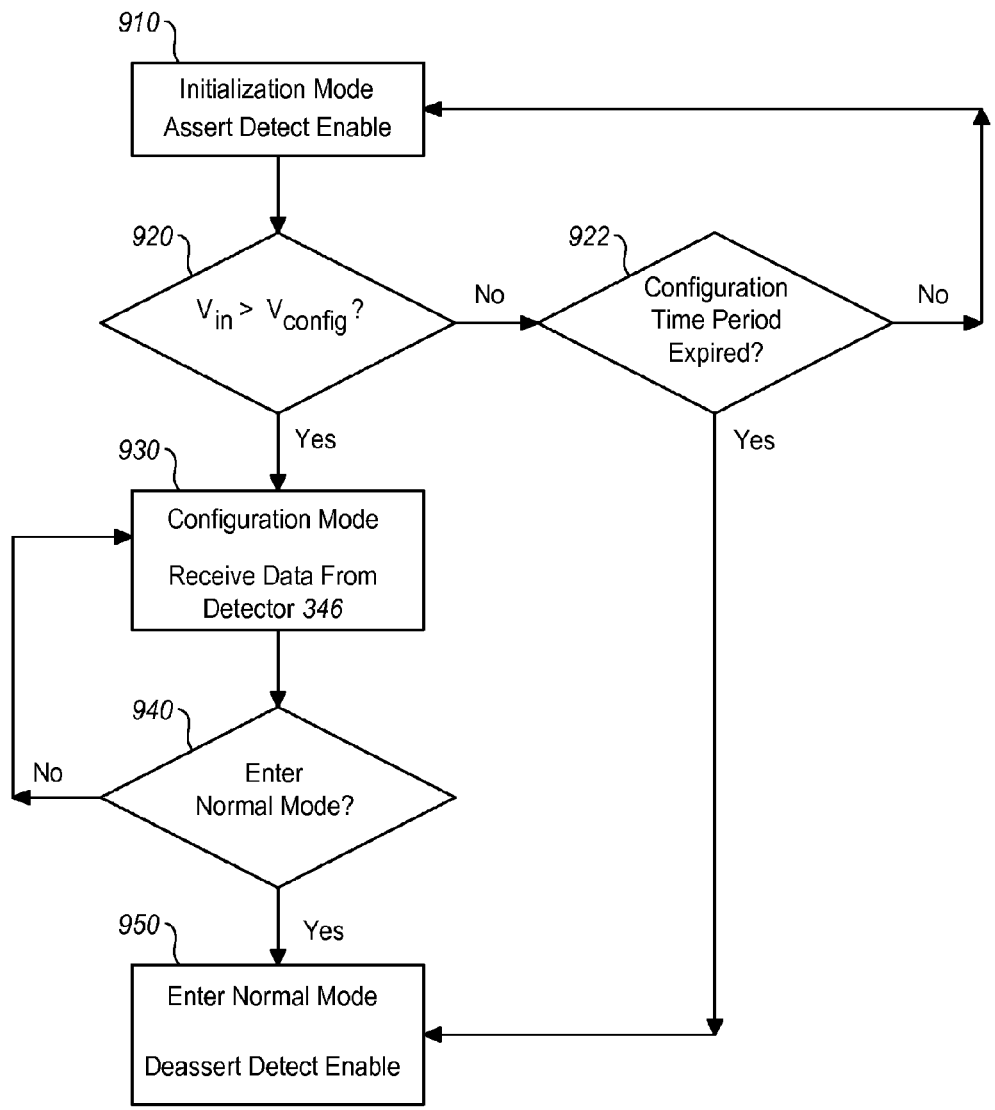
FIG. 9 depicts a method of using the small and flexible interface of the electronic module in FIG. 8 to configure the electronic module.
Figure 10:
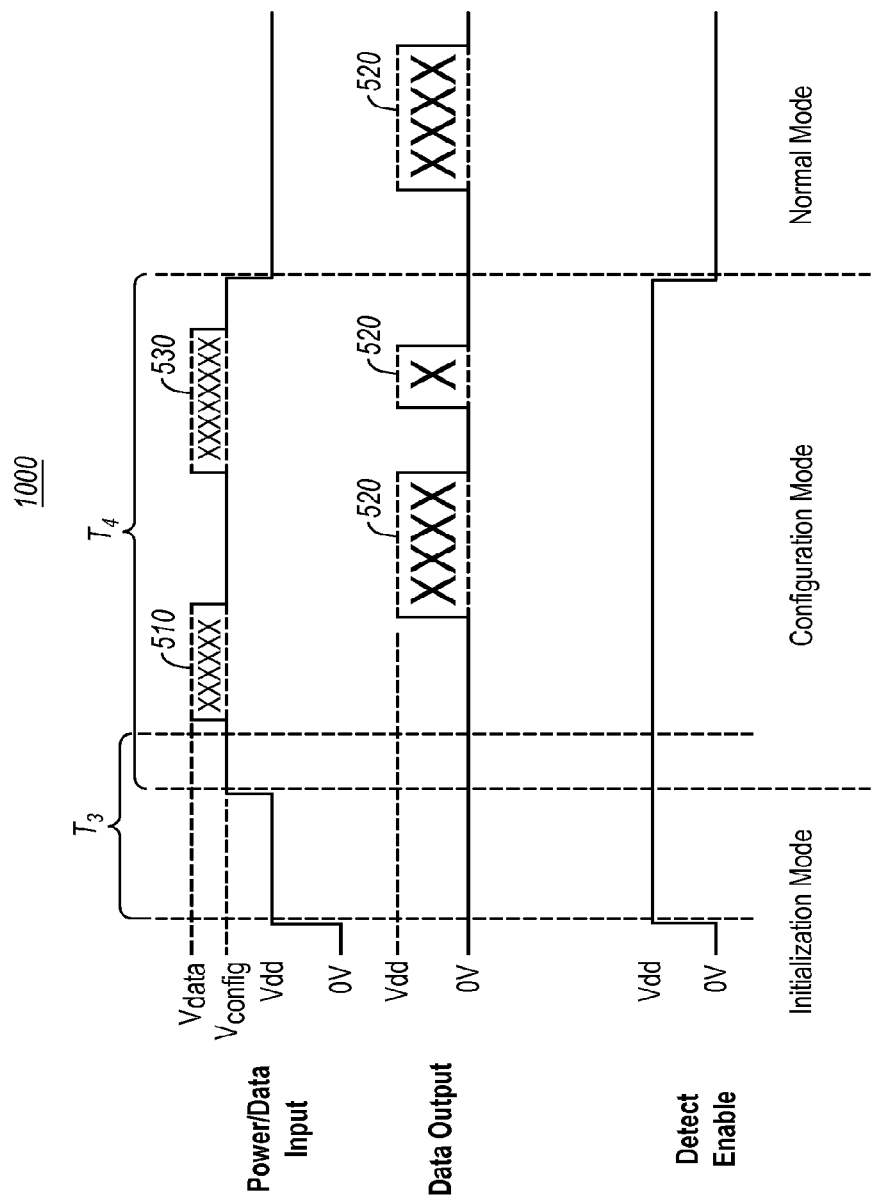
FIG. 10 depicts graphs of signaling levels within and at input and output terminals of the electronic module of FIG. 8 during different modes of operation.

FIG. 9 illustrates a flowchart of a method 900 for controlling the various operation modes of the module 800 of FIG. 8 and FIG. 10 illustrates a graph 1000, of signaling levels versus time at the input and output terminals of the module 800 and of the detect enable signal 820 during different modes of operation. Accordingly, the module 800 of FIG. 8 will now be described with frequent reference to the method 900 of FIG. 9 and the graph 1000 of FIG. 10.

After a power-up or a reset of the module 800, the module 800 enters an initialization mode in which a start-up or initialization routine is executed and the detect enable signal 820 is asserted (stage 910). During the initialization mode, if the controller 340 receives an indication from the detector 344 that a voltage level $V_{in}$ detected on the multi-use terminal 310 is greater than a first predetermined level $V_{config}$ for a predetermined amount of time (decision stage 920), the controller 340 causes the module 800 to enter a configuration mode (stage 930). In addition to determining whether to enter the configuration mode, the controller 340 determines whether a third predetermined time period (i.e., a configuration time period) $T_3$ is expired (stage 922). For example, the controller 340 may instruct the timer to begin counting down the configuration time period $T_3$ upon entering the initialization mode and the timer 350 may indicate to the controller when the configuration time period expires. If the configuration time period $T_3$ has not expired and the voltage level $V_{in}$ detected on the multi-use terminal 310 is not greater than the first predetermined level the module 800 continues to operate in the initialization mode (stage 910). If, however, the configuration time period $T_3$ does expire before the configuration mode is entered, the controller 340 causes the module 800 to enter the normal mode and de-assert the detect enable signal 620 (stage 950) without entering the configuration mode. Implementing a limited configuration time period will save power that would otherwise be dissipated by the network of voltage dividing resistors 354.

With reference to the graph 1000 of FIG. 10, while operating in the configuration mode, the sensor module 800 listens for data 510 to be received on the multi-use terminal 310. The data 510 is detected by the detector 346 and may be, for example, calibration data used to calibrate the sensor 348.

Referring again to the method 900 of FIG. 9, if, while operating in the configuration mode, a second predetermined criterion or set of criteria is satisfied (decision stage 940), the controller 340 causes the module 800 to enter the normal mode (stage 950). In the normal mode (stage 950), the controller 340 de-asserts the detect enable signal 720 to conserve power and causes the sensor module 100 to carry out its normal function(s), e.g., reading, processing, and outputting sensor data. Otherwise, the module remains operating in the configuration mode (stage 930). The second predetermined criteria may include a predetermined data sequence 530 detected by the detector 346, which the controller 340 receives and, in response thereto, causes the module 800 to enter the normal mode (stage 950). Alternatively, the second predetermined criteria may include a predetermined voltage level or expiration of a fourth predetermined time period $T_4$, as illustrated in the graph 1000 of FIG. 10.

In an alternative embodiment of the module 800 of FIG. 8, the timer 350 is omitted and mode selection is performed without the use of the time periods $T_3$ and $T_4$. Thus, the module 800 can enter and exit the configuration mode at any time, including during normal operations. For example, as discussed above, a non-timer-based criteria, such as the predetermined data sequence 530, may trigger transition from the configuration mode to the normal mode.

Moreover, to enable entry to the configuration mode, the detect enable signal 820 is pulsed or strobed at a periodic interval and a mode selection signal, such as the first voltage level $V_{config}$, or a unique code is detected on the multi-use terminal 310. By strobing the detect enable signal 820 the module 800 can enter the configuration mode at any time, including during normal operations. Although strobing the detect enable signal 820 would still dissipate some power by periodically activating the voltage divider network of resistors 354, some power is also conserved when the detect enable signal 820 is de-asserted.

In an example implementation of the alternative embodiment of the module 800, the detect enable signal 820 may be asserted for 10 ms of every 100 ms period and the output of the detector 344 is fed to a counter (not shown) that is integrated with or communicatively coupled to the controller 340. If after the controller 340 recognizes that a mode selection signal, such as the first voltage level $V_{config}$, is detected on the multi-use terminal 310 a predetermined number of times, the controller 340 causes the module 800 to exit whatever mode it happens to be in and enter the configuration mode to listen for data from the detector 346. The controller 340 is configured to reset the counter to zero if the mode selection signal is not detected when the detect enable signal 820 is asserted to avoid inadvertently triggering the configuration mode when noise events coincide with assertion of the detect enable signal 820. This inexpensive implementation of mode transition simulates a low pass filter of the signal on the multi-use terminal 310. The analog of this digital simulation of low pass filtering is an RC filter, which would typically consume much more chip area.

Figure 11:
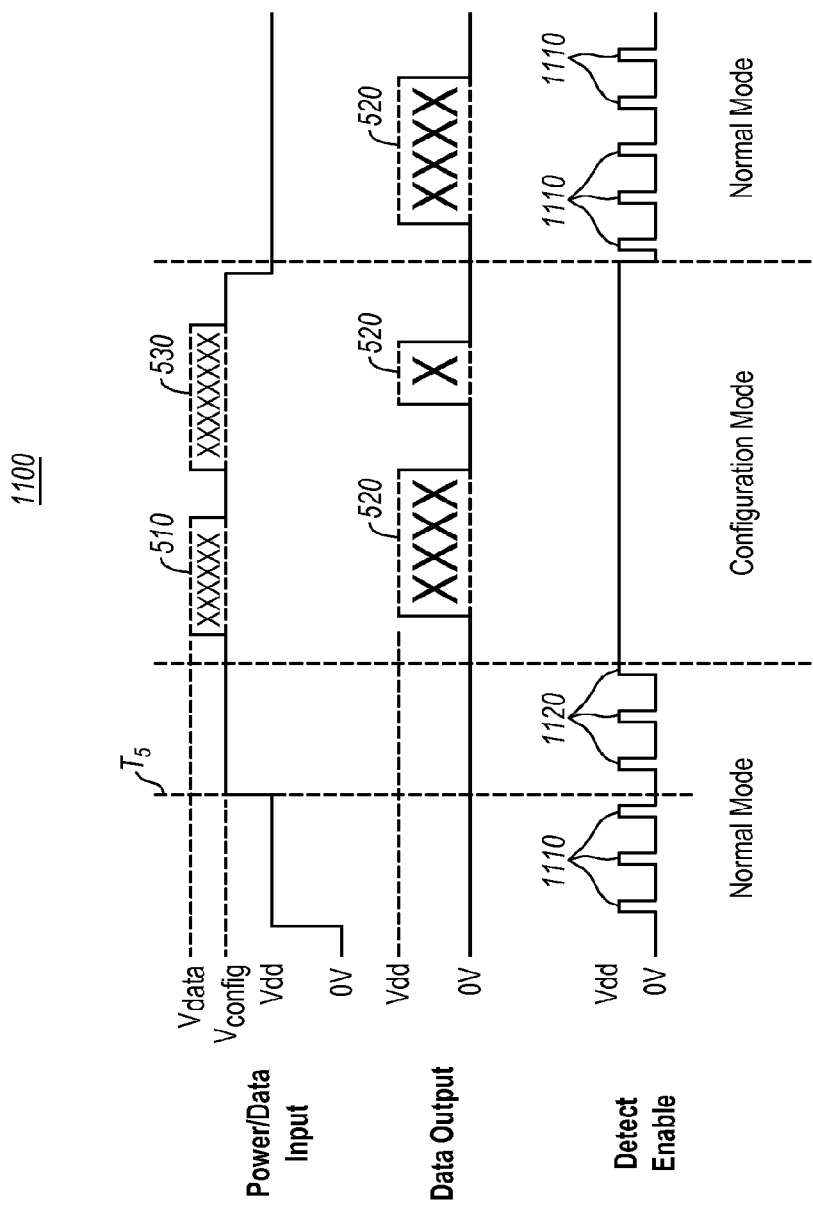
FIG. 11 depicts graphs of signaling levels within and at input and output terminals of an alternative timerless embodiment of the electronic module of FIG. 8 during different modes of operation.

FIG. 11 depicts a graph 1100 of signaling levels versus time at input and output terminals and of the detect enable signal 820 during different modes of operation of the timerless embodiment of the module 800. As shown in the graph 1100, the detect enable signal 820 is strobed at regular intervals depicted by a series of pulses 1110 and 1120. At time $T_5$ an external source applies the first voltage level $V_{config}$ to initiate transition to the configuration mode. The controller 340 detects the first voltage level $V_{config}$ at each of a series of consecutive pulses 1120 of the detect enable signal 820, which briefly enable detection by the detectors 344 and 346. If the first voltage level $V_{config}$ is detected a sufficient number of consecutive times (e.g., about three times to about twenty times depending on expected noise levels) the controller 340 causes the module 800 to enter the configuration mode. As shown in the graph 1100, the controller 340 asserts the detect enable signal 820 for the duration of the configuration mode to enable receipt of data by the detector 346.

By using a multi-use terminal to receive calibration data and power on a sensor module, the relatively small interface of the sensor module is used effectively for multiple operations in multiple modes and calibration can be performed quickly. Moreover, preserving the data output terminal for the sole purpose of outputting data minimizes the amount of extra hardware needed on the module to receive calibration data, enables full duplex bidirectional communications during the configuration mode, and increases communication speeds. Furthermore, the sensor modules described herein add only a few small, low-power consuming components to standard sensor modules to perform calibration functions. For example, the sensor modules described herein do not require integration of high power/low speed driving circuitry, which is included in certain other implementations to output data over the power supply terminal due to the significant amount of capacitance typically implemented on the power supply terminal. Instead, high power driving circuitry may only be needed in a test or programming system that is external to sensor modules of the present invention.

The foregoing detailed description of various embodiments is provided by way of example and not limitation. Accordingly, the present invention may be embodied in other specific forms without departing from its spirit or essential characteristics. For example, although the foregoing description is directed to sensor modules, any module or circuit that has a limited number of terminals (or for which a reduced numbers of terminals is desired to decrease interface complexity, for example) and a need to receive data for configuration, testing, upgrading firmware, or any other purpose for which input data or instructions is needed or expected to be needed at startup only and/or at relatively infrequent intervals during operation can benefit from the principles of the invention. Examples of such alternative modules include, among other things, a motor speed controller module, which may require an input at startup or during normal operation of a target speed to be maintained, an environmental parameter controller module, which may require an input at startup or during normal operation of a target environmental parameter to be maintained, or a data logger, which may require an input at startup or during normal operation of a desired parameter to be logged, an enable/disable setting, or the like.

Moreover, one of ordinary skill in the art will appreciate that the notation of $V_{dd}$ for the power supply voltage is exemplary and is not intended to limit implementation of the invention to one in which power is supplied to drain terminals of field effect transistors. Implementations that use bipolar junction transistors, for example, are also contemplated.

The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A sensor module, comprising:
   a voltage divider network having a first node, a second node, and a third node;
   a first detector having a first input terminal, a second input terminal, and an output terminal, the first input terminal of the first detector coupled to the first node and the second input terminal of the first detector coupled for receiving a first reference voltage;
   a controller having a first input terminal, a second input terminal, and a first output terminal, the first input terminal of the controller coupled to the output terminal of the first detector;
   a second detector having a first input terminal, a second input terminal, and an output terminal, the first input terminal of the second detector coupled to the second node and the second input terminal of the second detector coupled for receiving a second reference voltage and the output terminal of the second detector coupled to the second input terminal of the controller;
   a first transistor having a control terminal, a first current carrying terminal, and a second current carrying terminal, the first current carrying terminal of the first transistor coupled to the first input terminal of the first detector and the second current carrying terminal of the first transistor coupled to the first node;
   a second transistor having a control terminal, a first current carrying terminal, and a second current carrying terminal, the first current carrying terminal of the second transistor coupled to the first input terminal of the second detector and the second current carrying terminal of the second transistor coupled to the second node;
   a third transistor having a control terminal, a first current carrying terminal, and a second current carrying terminal, the control terminal of the third transistor coupled to the control terminals of the first transistor and the second transistor and to a third output terminal of the controller, the first current carrying terminal of the third transistor coupled to the first terminal of the second detector through a resistor, and the second current carrying terminal of the third transistor coupled for receiving the first source of potential;
   a voltage regulator having an input terminal and an output terminal, the input terminal of the voltage regulator coupled to the third node, and the output terminal of the voltage regulator coupled to the third input terminal of the controller; and
   a buffer having an input and an output, the input of the buffer coupled to the first output terminal of the controller and the output of the buffer serving as a data output terminal of the sensor module.

2. The sensor module of claim 1, further including an asynchronous receiver coupled between the output terminal of the first detector and the first input terminal of the controller.

3. The sensor module of claim 1, wherein the voltage divider circuit comprises a resistor divider network including:
   a second resistor having a first terminal and a second terminal, the first terminal of the second resistor coupled to the input terminal of the voltage regulator to form the third node, wherein the third node serves as a multi-use terminal of the sensor module that is configured for receiving calibration data from a source external to the sensor module and receiving power;
   a third resistor having a first terminal and a second terminal, the second terminal of the first resistor coupled to the first terminal of the third resistor to form the first node.

4. The sensor module of claim 1, wherein the first detector comprises a first comparator having a noninverting input terminal, an inverting input terminal, and an output terminal, the noninverting input terminal of the first comparator serving as the first input terminal of the first detector and the inverting input terminal of the first comparator serving as the second input terminal of the first detector and the second detector comprises a second comparator having a noninverting input terminal, an inverting input terminal, and an output terminal, the noninverting input terminal of the second comparator serving as the first input terminal of the second detector and the inverting input terminal of the second comparator serving as the second input terminal of the second detector.

5. The sensor module of claim 4, wherein the controller further includes a first input/output terminal, a second input/output terminal, and a third input/output terminal, and wherein the sensor module further includes a sensor coupled to the first input/output terminal of the controller, a data storage element coupled to the second input/output terminal of the controller, and a timer coupled to the third input/output terminal of the controller.

* * * * *